United States Patent
Hamamoto

(10) Patent No.: US 6,548,381 B2
(45) Date of Patent: Apr. 15, 2003

(54) ION BEAM IRRADIATION APPARATUS AND METHOD OF IGNITING A PLASMA FOR THE SAME

(75) Inventor: Nariaki Hamamoto, Kyoto (JP)

(73) Assignee: Nissin Electric Co., Ltd., Kyoto (JP)

( * ) Notice: Subject to any disclaimer, the term of this patent is extended or adjusted under 35 U.S.C. 154(b) by 0 days.

(21) Appl. No.: 10/131,085

(22) Filed: Apr. 25, 2002

(65) Prior Publication Data

US 2002/0164845 A1 Nov. 7, 2002

(30) Foreign Application Priority Data

Apr. 26, 2001 (JP) ........................................ 2001-129014

(51) Int. Cl.⁷ .......................... H01L 21/425; H05H 3/00
(52) U.S. Cl. ........................................ 438/514; 250/251
(58) Field of Search ................................ 438/514, 513, 438/515–517, 538, 798; 250/251

(56) References Cited

U.S. PATENT DOCUMENTS 5,576,538 A * 11/1996 Sakai et al. .................. 250/251
6,093,625 A * 7/2000 Wagner et al. .............. 438/514

FOREIGN PATENT DOCUMENTS

JP    07-153405    6/1995
JP    08-138886    5/1996

OTHER PUBLICATIONS

Guzdar et al., Charging of Substrate Irrdaiated by Particle Beams, Plasma Science, 1997, IEEE Conference Record, Abstract, 1997, p. 214.*

* cited by examiner

Primary Examiner—Olik Chaudhuri
Assistant Examiner—Hoa B. Trinh
(74) Attorney, Agent, or Firm—Finnegan, Henderson, Farabow, Garrett & Dunner LLP

(57) ABSTRACT

When a plasma is ignited in a plasma generator, an ion beam is made to run in the plasma generator, and in this state, a positive voltage with respective to ground is applied to a plasma production chamber from a DC power source. Secondary electrons are generated when the ion beam collides with a plasma generating gas which flows out of the plasma production chamber into a path of the ion beam. The secondary electrons are led into the plasma production chamber by the positive voltage, and within the plasma production chamber, a plasma ignition is triggered using the secondary electrons led into the plasma production chamber and a radio frequency.

6 Claims, 3 Drawing Sheets

ION BEAM IRRADIATION APPARATUS AND METHOD OF IGNITING A PLASMA FOR THE SAME

BACKGROUND OF THE INVENTION

1. Field of the Invention

The present invention relates to an ion beam irradiation apparatus for carrying out a process of implanting ions into a substrate by irradiating the substrate with an ion beam, and a method of operating the ion beam irradiation apparatus. The invention also relates to a method of manufacturing semiconductor devices by implanting ion beams into a semiconductor substrate in a manner that the substrate is irradiated with an ion beam, and more particularly to means for suppressing the accumulatively charging (charge-up) in the surface of the substrate when it is irradiated with the ion beam.

2. Description of the Related Art

When manufacturing semiconductor devices by ion implantation, it is important to suppress the charge-up of the substrate surface when it is irradiated with an ion beam. A charge-up suppressing technique has been proposed in the related art. In the proposed technique, plasma generated by a plasma generator is supplied to an upstream region of the substrate. Electrons contained in the plasma are used for neutralizing the positive charge of the substrate produced by the ion beam irradiation. The proposed technique supplies electrons of lower energy to the substrate, when compared with the technique of utilizing primary electrons emitted from a filament or secondary electrons emitted from an object when the object is irradiated with the primary electrons emitted from the filament. Accordingly, the proposed technique has an advantage of reducing the negative charge in the substrate.

A plasma generator of a radio frequency discharge type is known which generates a plasma by ionizing, using radio frequency discharge, a plasma generating gas that is led into a plasma production chamber. This type of plasma generator is advantageous over the plasma generator of the type which uses the filament for the discharge in the following points: a) the plasma has a long lifetime, and b) it is operable at low gas pressure, and hence the vacuum within a process chamber can be maintained while the plasma is being generated.

One of the problems involved in the plasma generator of the radio frequency (RF) discharge type which utilizes radio frequency discharging for the plasma generation, resides in the plasma ignition.

The plasma generator of the RF discharge type usually includes an electrode (capacitively coupling), e.g., an antenna, or a coil (inductively coupling) for introducing a radio frequency wave into a plasma production chamber. Usually, a magnetic field for generating a plasma and maintaining the generated plasma is applied into the plasma production chamber.

In this case, to ignite a plasma, at least one electron must exist within the plasma production chamber. The electron, accelerated by a high RF electric field, hits an atom or a molecule to ionize them. Then, the electrons emitted as a result of the ionization successively ionize other atoms or molecules. Thus, a plasma is suddenly generated at a certain time point, or in other words, a plasma is ignited.

It is generally considered that the first electron is produced in such a way that high-energy particle beams coming from outer space ionize a gas. The number of electrons that high energy particle beams produce by hitting a gas is much smaller than the number of thermions (usually, several mA) emitted by the filament, for example. Accordingly, it is difficult to reliably ignite a plasma by merely introducing an RF wave into the plasma production chamber.

To reliably ignite an RF plasma, the following methods are employed in the related art.

1) A discharge gap is formed in the plasma production chamber. A high voltage is applied across the gap to cause a discharge, and in turn, the discharge generates a great number of electrons.

2) Laser light of high energy density is introduced into the plasma production chamber. A plasma is ignited by thermally ionizing a plasma generating gas using direct laser light.

In method 1) above, at least one discharge gap electrode having an exposed metal part must be provided within the plasma production chamber. Further, a high voltage source for applying a high voltage to the electrode must also be provided. As a result, the device used for method 1) has complex construction which increases its costs.

After the plasma ignition, the discharge gap electrode is exposed to the plasma and sputtered. Then, the sputtered particles (metal particles) reach the substrate. This results in metal contamination of the substrate.

Further, the discharge causes a surge voltage. Accordingly, there is a danger that the surge voltage adversely affects components of the device, such as for example, the control devices of low voltage in an ion beam irradiation apparatus.

Method 2) requires a laser light source and a laser light transmission window for introducing a laser light emitted from the laser light source into the plasma production chamber. Again, like in method 1), the device used for method 2) has complex construction which increases its costs.

In addition, material deposited during the plasma generation accumulatively attaches to the laser light transmission window. If the amount of the deposited material grows to interrupt the laser light, the plasma ignition becomes impossible. In this case, maintenance is frequently carried out to clean the deposited material, which can become cumbersome.

SUMMARY OF THE INVENTION

Accordingly, a principal object of the present invention is to provide a method and apparatus which are capable of reliably and simply igniting a plasma without creating problems such as metal contamination, in a plasma generator of the RF discharge type for the substrate charge-up suppression as mentioned above.

According to one aspect of the present invention, there is provided a method of operating an ion beam irradiation apparatus. In the operating method, when a plasma is ignited in the plasma generator, the ion beam travels beside or in the vicinity of the plasma generator, and in this state a voltage, positive with respective to ground, is applied to the plasma production chamber. Further, secondary electrons, which are generated when the ion beam collides with the plasma generating gas which flows out of the plasma production chamber into a path of the ion beam, are led into the plasma production chamber by the positive voltage, and in the plasma production chamber a plasma ignition is triggered with the secondary electrons led into the plasma production chamber.

In the operating method, an amount of secondary electrons, which is high enough to reliably ignite the plasma, may be led into the plasma production chamber. Accordingly, a plasma may be reliably ignited in the plasma production chamber.

The operating method advantageously utilizes the ion beam, which is originally present for the processing of the substrate, for generating secondary electrons and in turn, the plasma ignition. The plasma may be ignited by the utilization of the ion beam and by applying a positive voltage to the plasma production chamber. Accordingly, the plasma ignition operation is very simple, and complicated means are not needed for the plasma ignition. Further, the operating method does not cause the problems of metal contamination, surge voltage generation, or complicated maintenance.

According to another aspect of the invention, there is provided an ion beam irradiation apparatus which is characterized by a DC power source which applies a voltage, positive with respective to ground, to the plasma production chamber, and leads secondary electrons, which are generated when the ion beam collides with the plasma generating gas which flows out of the plasma production chamber into a path of the ion beam, into the plasma production chamber by the positive voltage, and triggers a plasma ignition with the secondary electrons led into the plasma production chamber, in the plasma production chamber.

In the ion beam irradiation apparatus, an amount of secondary electrons, which is high enough to reliably ignite the plasma, may be led into the plasma production chamber. Accordingly, a plasma may reliably be ignited in the plasma production chamber.

The ion beam irradiation apparatus advantageously utilizes the ion beam, which is originally present for the processing of the substrate, for generating secondary electrons and in turn, the plasma ignition. Means additionally used for igniting the plasma are only a DC power source for applying a positive voltage to the plasma production chamber. Accordingly, the plasma igniting operation is very simple, and there is no need of using complicated means for the plasma ignition. Further, the ion beam irradiation apparatus does not cause the problems of metal contamination, surge voltage generation, or complicated maintenance.

According to yet another aspect of the invention, there is provided an ion beam irradiation apparatus which is characterized by a DC power source which is capable of selecting one of the following operations:

a) to apply a voltage, positive with respective to ground, to the plasma production chamber, and to lead secondary electrons, which are generated when the ion beam collides with the plasma generating gas which flows out of the plasma production chamber into a path of the ion beam, into the plasma production chamber by the positive voltage, and to trigger a plasma ignition with the secondary electrons led into the plasma production chamber, in the plasma production chamber, and b) to apply a voltage, negative with respective to ground, to the plasma production chamber, thereby controlling an amount of electrons emitted from the plasma production chamber.

In the ion beam irradiation apparatus, the DC power source controls not only the plasma igniting operation as mentioned above, but also an amount of electrons emitted from the plasma production chamber after the plasma ignition. By the control of the amount of emitted electrons, the charge-up in the substrate surface is suppressed to be lower, and the charge voltage of the substrate surface maybe further reduced. Moreover, one DC power source may be used for both the plasma ignition control and the emitted electron amount control. Therefore, the construction is simplified and the cost is reduced when comparing with the case where the power sources are used for those controls, respectively.

According to an additional aspect of the invention, there is provided a method of fabricating semiconductor devices by implanting ions into semiconductor substrates by irradiating the substrate with an ion beam. The method uses a plasma generator which generates a plasma by ionizing a plasma generating gas as introduced into a plasma production chamber by a radio frequency discharge, and supplies the generated plasma to an upstream region of the semiconductor substrate, thereby suppressing the charge-up in a surface of the semiconductor substrate caused by ion beam irradiation. In the semiconductor device fabricating method, the following steps are executed:

A) the ion beam is generated in the plasma generator, and in this state a voltage, positive with respect to ground, is applied to the plasma production chamber, and secondary electrons, which are generated when the ion beam collides with the plasma generating gas which flows out of the plasma production chamber into a path of the ion beam, are led into the plasma production chamber by the positive voltage, and within the plasma production chamber a plasma ignition is triggered with the secondary electrons led into the plasma production chamber, and B) then, in a state that a voltage, negative with respective to ground, is applied to the plasma production chamber, a plasma is emitted out of the plasma production chamber, and led to an upstream region of the semiconductor substrate, whereby an ion beam is irradiated on the semiconductor substrate while suppressing the charge-up in the semiconductor substrate, caused by ion beam irradiation.

Where this method is used, the plasma can reliably be ignited in the plasma generator as described above, and complicated means are not needed for the plasma ignition. Further, the ion beam irradiation apparatus does not cause the problems of metal contamination, surge voltage generation, or complicated maintenance. Metal contamination of the semiconductor substrate is a serious problem in the fabrication of the semiconductor devices. The invention can prevent this problem. Accordingly, the invention improves the performances of the semiconductor device, and the production yield in the stage of manufacturing the semiconductor devices.

Additionally, an amount of electrons emitted from the plasma production chamber can be controlled by applying a negative voltage to the plasma generator when the semiconductor substrate is irradiated with the ion beam. By the electron amount control, the charge-up in the substrate surface is suppressed to be lower, and the charge voltage of the substrate surface may be more reduced. As a result, the dielectric breakdown of the semiconductor device during the ion beam irradiation is prevented to improve the production yield in the fabrication stage of the semiconductor device. Further, the fabrication method may also be applied to the microfabrication of semiconductor devices.

DESCRIPTION OF THE PREFERRED EMBODIMENTS

Figure 1:
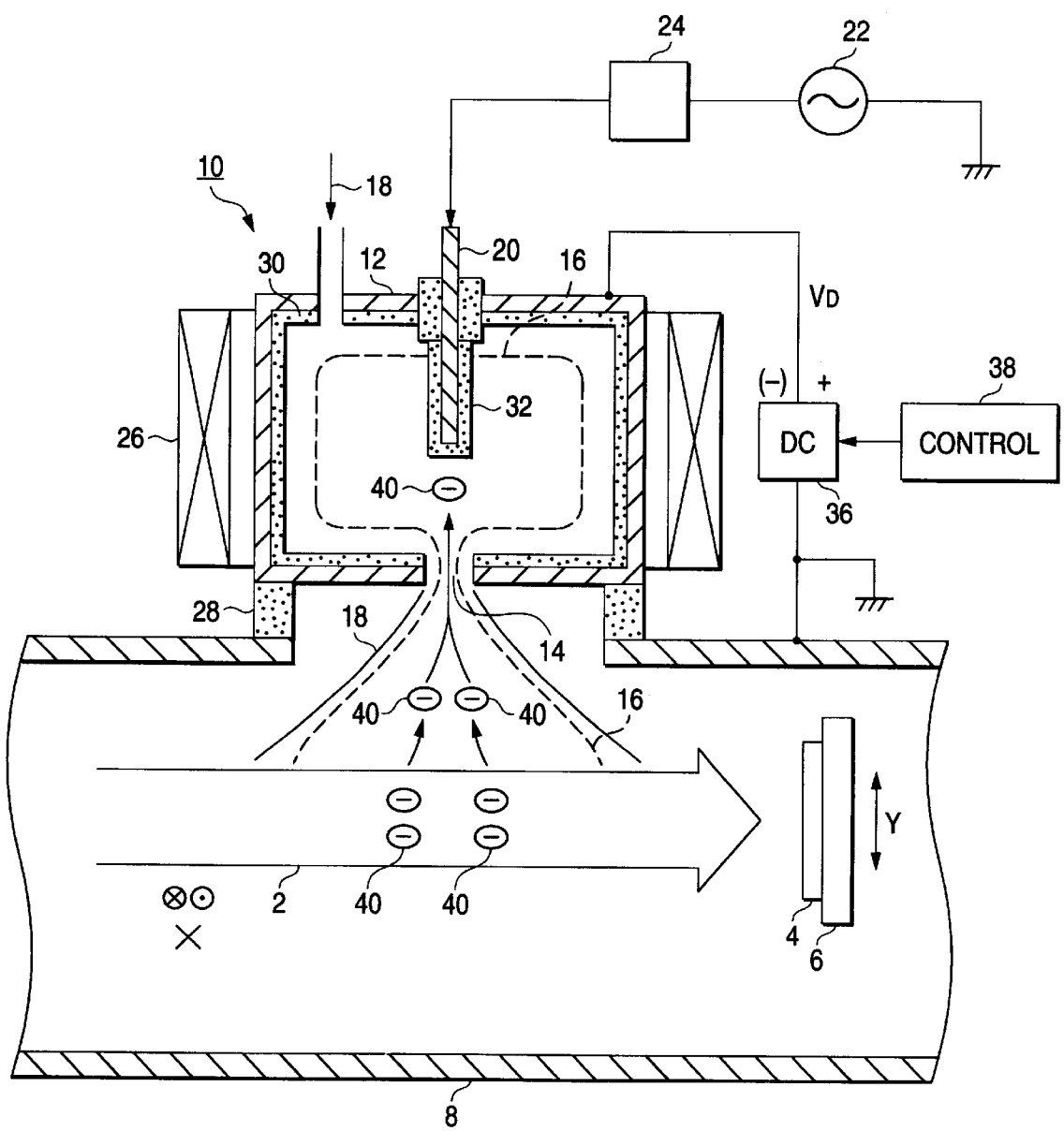
FIG. 1 is a cross sectional view showing an ion beam irradiation apparatus constructed according to the present invention.

FIG. 1 is a sectional view showing an embodiment of an ion beam irradiation apparatus according to the present invention.

In the ion beam irradiation apparatus shown in FIG. 1, in a vacuum chamber 8, a substrate (e.g., a semiconductor substrate) 4 held by a holder 6 is irradiated with an ion beam 2. Then, a process of implanting ions into the substrate 4 is carried out.

In order to uniformly irradiate the entire surface of the substrate 4 with the ion beam 2, either the ion beam 2 or the substrate 4 is moved for scanning when the ion beam 2 is irradiated. In the embodiment, the ion beam 2 and the substrate 4 are moved in X and Y directions respectively. As shown, the X and Y directions are perpendicular to each other. Of course, this does not preclude embodiments where the ion beam 2 is moved in a Y direction with the substrate 4 moved in an X direction.

A plasma generator 10 of the radio frequency discharge type is provided to generate a plasma 16 by radio frequency discharge and then supply the generated plasma to an upstream region of the substrate 4. Specifically, the plasma generator 10 supplies the generated plasma to the region of the upstream side and a position near the ion beam 2 scanning at the upstream side to thereby suppress a charge-up on a surface of the substrate 4 which is irradiated using ion beam 2.

A plasma generating gas 18 is introduced into a plasma production chamber 12 of the plasma generator 10. The plasma generating gas 18 is ionized by a radio frequency discharge to there by generate the plasma 16. Then, the plasma 16 is emitted outside of the plasma production chamber 12 through a plasma emission hole 14 to meet the ion beam 2. The emitted plasma 16 includes electrons and ions.

The plasma emission hole 14 need not be limited to a single plasma emission hole 14, and a plurality of holes may be used as desired. For example, when the ion beam 2 is moved for scanning as in the embodiment, a plurality of the plasma emission holes 14 may be arranged in the scanning direction X of the ion beam. The plasma emission hole 14 may also take the form of a slit being elongated in the X direction.

A radio frequency wave is supplied from a radio-frequency power source 22 to the antenna 20 via an impedance matching device 24. The RF wave may bean RF wave of approximately 13.56 MHz or a microwave of approximately 2.45 GHz. In the specification, the term "radio frequency" is used to describe the broad concept of frequencies in the "microwave" range.

The antenna 20 may take any suitable form. As non-limiting examples, the antenna 20 may take the form of a loop and a plate electrode or a bar-like form as illustrated. Alternatively, for an inductively coupling process, a coil may be used for generating the plasma 16 instead of the antenna 20.

In view of a voiding contamination of the plasma production chamber 12 and generation of organic materials from being produced, a chemically inactive gas is preferably used for the plasma generating gas 18. Examples of gases preferable for the plasma generating gas 18 are inert gases (noble gases), such as argon, krypton or xenon.

It is preferable to apply a magnetic field to the interior of the plasma production chamber 12 to facilitate the generation and maintaining of the plasma 16. In the embodiment, the magnetic field generating device is realized such that a magnetic coil 26 is disposed around the plasma production chamber 12. Alternatively, a permanent magnet may be substituted for the magnetic coil 26. The direction of a magnetic field developed by the magnetic field generating device is not limited to a specific direction. However, it is preferably directed in a direction in which the plasma 16 is emitted through the plasma emission hole 14 (an axial direction, as shown in FIG. 1.). If the magnetic field is so directed, the emission of the plasma 16 as well as the leading of secondary electrons 40 into the plasma production chamber 12 is made easier. In this embodiment the magnetic coil 26 develops a magnetic field having such a direction.

The inner wall of the plasma production chamber 12 and the antenna 20 are preferably covered with insulating members 30 and 32, respectively as shown in the embodiment in order to suppress the metal contamination from the inner wall 12 and the antenna 20. Metal contamination usually results from the sputtering by the plasma 16.

The plasma production chamber 12 is electrically insulated from ground (a ground potential part) by using an insulating member 28 being interposed there between. The vacuum chamber 8 is normally set at ground potential. A DC power source 36 is connected between the plasma production chamber 12 and ground.

To ignite the plasma 16 in the plasma production chamber 12, the DC power source 36 may be a normal DC power source which applies a voltage, positive with respect to ground, to the plasma production chamber 12. This embodiment uses a DC power source cable of selectively applying a positive voltage or a negative voltage (with respective to ground) to the plasma production chamber 12. The reason for this will be described later. The DC power source 36 may be a bipolar power source capable of applying a positive voltage and a negative voltage, or may be a combination of a normal DC power source of the unipolar type and a switching circuit for inverting the output voltage polarities.

Figure 2:
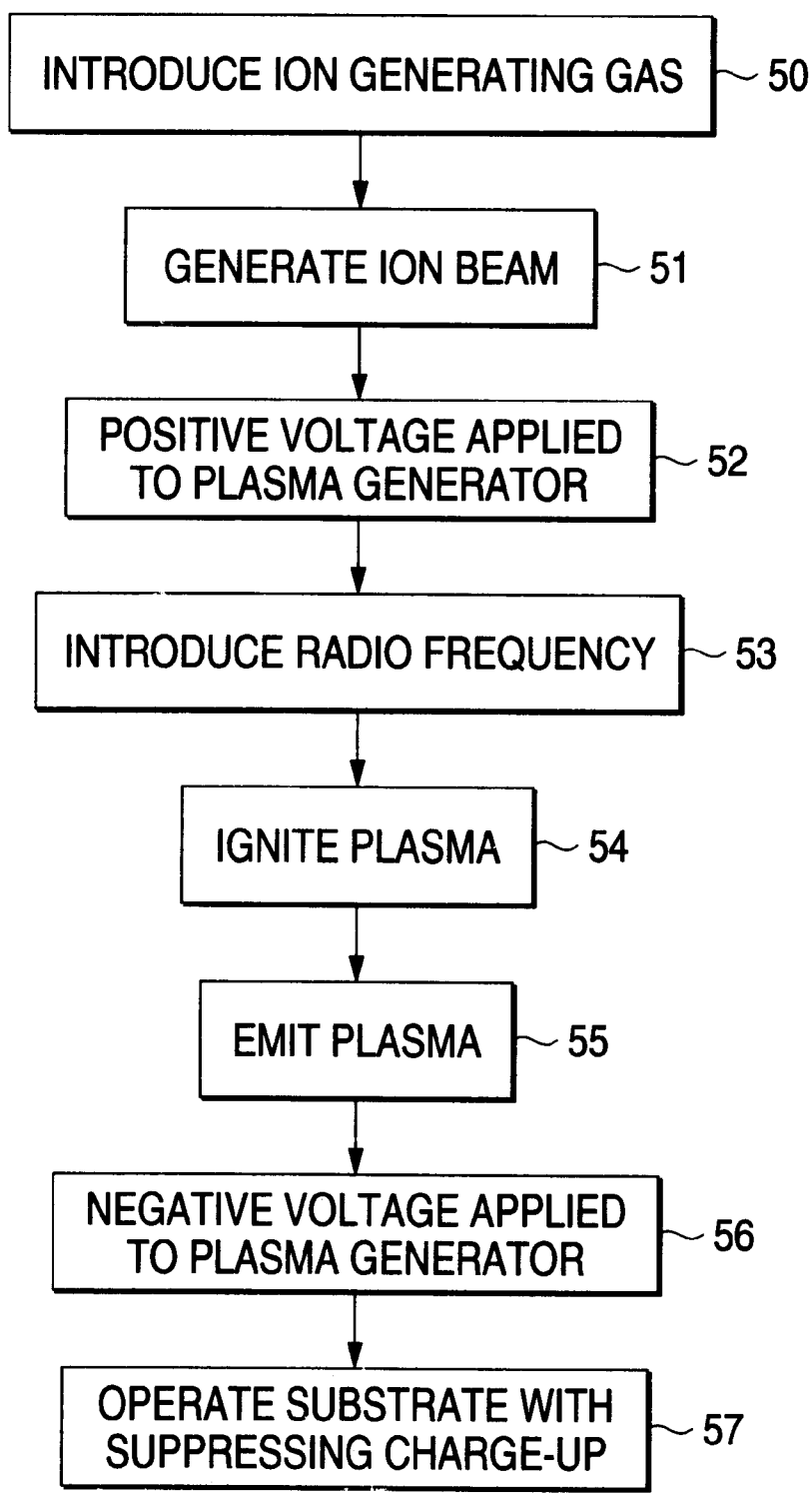
FIG. 2 is a flow chart showing an example of a method of operating the FIG. 1 ion beam irradiation apparatus.

As a non-limiting example, a method of operating the ion beam irradiation apparatus will be exemplarily described with reference to FIG. 2.

1) Process Until Plasma Ignition

To ignite a plasma 16 in the plasma generator 10, a plasma generating gas 18 is led into the plasma production chamber 12 (step 50). An ion beam 2 is generated and made to move for scanning in front of the plasma generator 10 as shown in FIG. 1 (step 51). To prevent the ion beam 2, not yet neutralized, from being irradiated on the semiconductor substrate 4, the substrate 4 and the holder 6 are preferably retracted from the ion beam 2.

The plasma generating gas 18 as is introduced into the plasma production chamber 12 flows out through the plasma emission hole 14 into a scanning path of the ion beam 2, as shown in FIG. 1, and collides with the ion beam 2. More specifically, ions included in the ion beam 2 hit atoms or molecules in the plasma generating gas 18 having flowed out. As a result of the collision with the ion beam 2, a part of the plasma generating gas 18 is ionized and the secondary electrons 40 are generated. Some of the generated secondary electrons 40 are attracted to the ions of the ion beam 2, and led into the ion beam 2, and some of the secondary electrons 40 are kicked out of the ion beam 2. The reason for this is that the generated secondary electrons 40 have a kinetic energy to some degree.

At this time, when a positive voltage is applied from the DC power source 36 to the plasma production chamber 12 (step 52), the secondary electrons 40 kicked out of the ion beam 2 are attracted to the plasma production chamber 12 under the positive voltage, and part of the secondary electrons 40 are led into the plasma production chamber 12 through the plasma emission hole 14. Those electrons serve as trigger electrons for the plasma ignition. The number of the electrons is much larger than that of electrons naturally generated by the particle beams coming from outer space.

In this state, an RF wave is led into the plasma production chamber 12 through the antenna 20. Then, the secondary electrons 40 led thereinto reliably trigger the ignition of the plasma 16 (step 54).

Therefore, neither the use of the discharge gap nor the radiation by the laser light of high energy density is needed to ignite the plasma. Accordingly, the problems arising from the discharge gap and the laser light irradiation are readily solved. The means used for igniting the plasma can be reduced to include the DC power source 36 for applying a positive voltage to the plasma production chamber. Accordingly, there is no need of using complicated means for the plasma ignition. This, of course, leads to apparatus cost reduction. Further, the ion beam irradiation apparatus of the present invention does not cause the problems of metal contamination, surge voltage generation, or complicated maintenance.

The positive voltage applied from the DC power source 36 to the plasma production chamber 12 functions to pull the generated secondary electrons 40 into the plasma production chamber 12 and to accelerate the secondary electrons 40 to increase their energy. The applied voltage will be further described. The secondary electrons 40 led into the plasma production chamber 12 do not serve as trigger electrons until their energy is at a predetermined energy level or higher. The reason for this is that to ionize the plasma generating gas 18, at least the energy of the secondary electrons 40 must be at the first ionizing energy level of atoms or molecules of the plasma generating gas 18. Assuming that the first ionizing energy of the atoms of the plasma generating gas 18 is E1 [eV], and the energy that the secondary electrons 40 generated by their collision with the ion beam 2 have is E2 [eV], then the positive voltage applied to the plasma production chamber 12, that is, the output voltage VD[V] of the DC power source 36, is preferably selected so as to satisfy the following relationship. In the relationship as shown below, "e" is an elementary charge. By dividing the right side of the equation by this elementary charge, the energy is converted into voltage.

Formula 1

$$VD \geq (E1-E2)/e \; [V]$$

The secondary electrons 40 having the energy E2 are further accelerated by the voltage VD to have energy in excess of the first ionizing energy E1. As a result, the secondary electrons are pulled into the plasma production chamber 12. Therefore, the plasma is reliably ignited.

The first ionizing energy E1 of the atoms including the plasma generating gas 18 is about 16 eV for argon, about 14 eV for krypton, and about 12 eV for xenon. The energy E1 of the secondary electrons 40 which are kicked out as the result of the collision is about 8 eV at the maximum under the conditions that the ion beam 2 is a phosphorus (P+) ion beam and the plasma generating gas 18 is xenon. Accordingly, in this case, the output voltage VD is selected to be preferably 4V or higher since 12−8=4 [V] as taught by the formula 1 above.

Practically, the value of the output voltage VD is selected to preferably be any of some large values of those values which satisfy formula 1. The reason for this follows.

a) Generally, ionization cross section of the ionizing of the plasma generating gas 18 by the electrons is maximized when the energy of electrons is approximately two to three times as large as the first ionizing energy E1. Therefore, it is preferable to select the output voltage VD so that the energy of the secondary electrons 40 are around these same values.

b) The secondary electrons 40 kicked out when the ion beam 2 collides with the plasma generating gas 18 are substantially and isotopically emitted at low energy. As the output voltage VD increases, the amount of secondary electrons 40 moving to the plasma production chamber 12 may be increased.

c) A magnetic field, normally, is applied to the plasma production chamber 12 as already stated. Accordingly, when the secondary electrons 40 are under the magnetic field of some direction, the secondary electrons go out of an orbit by a deflection of the magnetic field and are hardly pulled into the plasma production chamber 12. In this case, an influence of the deflection is lessened if the output voltage VD is increased to a certain level of voltage to strongly accelerate the secondary electrons 40 toward the plasma production chamber 12. When a magnetic field is applied to the plasma production chamber in a direction along the direction in which the plasma 16 is emitted through the plasma emission hole 14, the secondary electrons 40 are easily brought into the plasma production chamber 12 through the plasma emission hole 14. As such, the magnetic field acts in a preferable direction.

A specific example of this will be given. In the example, a flow rate of the plasma generating gas Xe 18 led into the plasma production chamber 12 is 0.2 ccm; a vacuum degree of the vacuum chamber 8 is $1.2 \times 10^{-3}$ Pa; a beam current of a 70 keV P+ ion beam is 1 mA; and an effective area of the plasma production chamber as viewed from the ion beam 2 is about 10 cm2. Further, the output voltage VD is set at 10V. When the secondary electrons 40 impinge on the plasma production chamber 12, a current flowing through the DC power source 36 is about 50 µA under the above described conditions. This value is relatively large. Thus, it is seen that when the positive voltage is applied to the plasma production chamber 12, a great amount of secondary electrons 40 is attracted to the plasma production chamber 12. Part of the attracted secondary electrons 40 are pulled into the plasma production chamber 12 through the plasma emission hole 14, and serve as trigger electrons. Therefore, the plasma is ignited by the trigger electrons.

2) Process until the Substrate Processing

When the plasma 16 is ignited in the plasma generator 10 in a way as described above, the plasma 16 is naturally emitted through the plasma emission hole 14 into the vacuum chamber 8 by the pressure difference or other factors (step 55). The emitted plasma 16 spreads and is supplied to a region near the upstream part of the semiconductor substrate 4 and a region near the ion beam 2 moving for scanning thereat.

The fact that the plasma 16 is emitted through the plasma emission hole 14 means that both electrons and ions are emitted. The emitted electrons normally have low energy. At this time, the output voltage polarities of the DC power source 36 are inverted and a voltage, negative with respective to ground, is applied to the plasma production chamber 12 (step 56). Then, the output voltage VD of the DC power source 36 acts in such a direction as to pull out electrons from the plasma production chamber 12. Accordingly, the amount of electrons emitted from the plasma generator 10 may be controlled. More exactly, the amount of emitted electrons may be controlled by adjusting a value of the output voltage VD and the polarities thereof.

When the semiconductor substrate 4 is processed by irradiating it with the ion beam 2, the plasma 16 is supplied to the vicinity of the ion beam 2 and the semiconductor substrate 4. Then, electrons in the plasma 16 are attracted to the substrate surface having been positively charged by the ion irradiation, and neutralize the positive charge. The electrons are also caught by the ion beam 2 forming a beam plasma, and move toward the semiconductor substrate 4 in the beam plasma by a potential of the semiconductor substrate 4 (when it is charged). Therefore, the electrons neutralize the positive charge of the substrate. When the positive charge on the surface layer is neutralized, the attraction of electrons to the semiconductor substrate 4 automatically stops. In this way, the charge-up on the substrate surface by the ion beam irradiation is suppressed (step 57).

In this case, an amount of the emitted electrons supplied to the semiconductor substrate 4 may be appropriately controlled by applying the negative voltage from the DC power to the plasma production chamber 12. By the control of the emitted electron amount, the charge-up on the substrate surface is suppressed to be lower. Further, the charge-up voltage of the substrate surface may be also reduced.

To carry out the control of both the plasma ignition and the emitted electron amount, DC power sources maybe separately provided. For example, a DC power source for applying the positive voltage to the plasma production chamber 12 and another DC power source for applying the negative voltage to the same. In this embodiment, one DC power source 36 is used for controlling both the plasma igniting operation and the amount of emitted electrons. Therefore, the construction is simplified and the cost is reduced when comparing with the case of using the separate DC power sources for those controls.

The switching of the polarities of the DC voltage output from the DC power source 36 and the magnitude of the DC voltage may be controlled by a control unit 38.

The plasma generator 10 may be provided within the vacuum chamber 8 so as to locate it close to the ion beam 2. The plasma generator may also be provided within a tubular container, which is inserted into the vacuum chamber 8. Either way, the plasma production chamber 12 is electrically insulated from ground since the voltage as mentioned above is applied to it.

Figure 3:
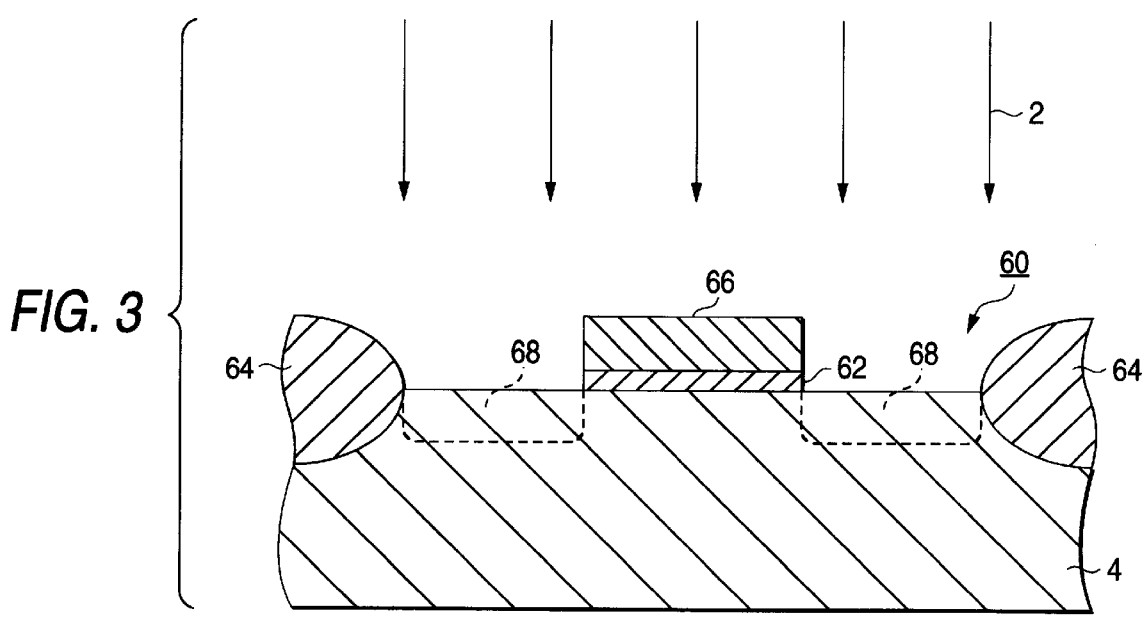
FIG. 3 is an enlarged, cross sectional view showing an example of a semiconductor device.

A method of fabricating semiconductor devices 60 as shown in FIG. 3 by an ion implantation process based on the ion irradiation, will now be described. An FET (field effect transistor), more exactly a MOSFET (MOS field effect transistor) is exemplified for the semiconductor device 60. To fabricate such a semiconductor device 60, a semiconductor substrate (e.g., silicon substrate) is used for the semiconductor substrate 4. A gate oxide film 62 and an element-separating oxide film 64 are formed in predetermined regions of the substrate surface. An electrode 66 is formed on the surface of the gate oxide film 62.

Ion beams 2 are irradiated on the semiconductor substrate 4 thus formed to implant a dopant ion (e.g., boron, phosphorus, arsenic) into the substrate. Two impurity doped layers 68 are formed in the surface region of the semiconductor substrate 4 and on both sides of the gate electrode 66 and the gate oxide film 62. The impurity doped layer 68 is of the p-type when boron is doped as the dopant ion, and of the n-type when phosphorus or arsenic is implanted. In a case where the semiconductor substrate 4 is of the n type, a p/n junction is formed by forming the impurity doped layers 68 of the p type. One of the impurity doped layers 68 functions as a source, and the other as a drain. Thus, a p-channel MOSFET is formed as the semiconductor device 60. In a case where the semiconductor substrate 4 is of the p type, a p/n junction is formed by forming the impurity doped layers 68 of the p type. One of the impurity doped layers 68 functions as a source, and the other as a drain. Thus, an n-channel MOSFET is formed as the semiconductor device 60. Actually, a number of semiconductor devices 60 thus structured are formed in the surface region of the semiconductor substrate 4.

For manufacturing such semiconductor devices 60 by the utilization of such an ion irradiation process, the above-mentioned charge-up suppressing technique is applied to the plasma generator 10. This will be described again in brief (see also FIG. 1).

Specifically, in a first step, an ion beam 2 is generated. In this state, a positive voltage with respect to ground is applied from the DC power source 36 to ground. Secondary electrons 40 are then generated when a plasma generating gas 18, flowing out of the plasma production chamber 12 to the scanning path of the ion beam 2, collides with the ion beam 2. The generated secondary electrons 40 are led into the plasma production chamber 12 by the positive voltage, wherein the generated secondary electrons 40 trigger the ignition of a plasma in the plasma production chamber 12.

In a second step, a negative voltage with respective to ground is applied from the DC power source 36 to the plasma production chamber 12, and a plasma 16 is emitted out of the plasma production chamber 12 and supplied to a region near the semiconductor substrate 4. In this way, an ion beam is irradiated on the semiconductor substrate 4 while suppressing the charge-up in the semiconductor substrate 4, which results from the ion beam irradiation.

Where this method is applied, the plasma can reliably be ignited in the plasma generator 10 as mentioned above. Further, complicated means is not needed for the plasma ignition. Furthermore, the ion beam irradiation apparatus does not cause the problems of metal contamination, surge voltage generation, or complicated maintenance. Metal contamination of the semiconductor substrate is a serious problem in the fabrication of semiconductor devices. The invention can prevent this problem. Accordingly, the invention improves both the performance of the semiconductor devices as well as the production yield during manufacturing of the semiconductor devices.

Additionally, the amount of electrons emitted from the plasma production chamber 12 can be controlled by applying a negative voltage to the plasma generator 12 when the semiconductor substrate 4 is irradiated with the ion beam 2. By controlling the electron amount, the charge-up on the substrate surface is suppressed, and the charge voltage of the substrate surface may be further reduced. As a result, the dielectric breakdown of the semiconductor device during the ion beam irradiation is prevented, which improves the production yield during the fabrication stage of the semiconductor device. With progress of microfabrication of the semiconductor device, the charge-up voltage of the substrate surface at the time of ion implantation must be held at a potential as low as possible in order to prevent the dielectric breakdown of a semiconductor device. The fabrication method of the invention is capable of meeting such a requirement. Accordingly, the fabrication method may also be applied to the microfabrication of semiconductor devices.

As seen from the foregoing description, the present invention has the following meritorious effects.

An amount of secondary electrons, which is high enough to reliably ignite the plasma, may be led into the plasma production chamber. Accordingly, a plasma may reliably be ignited in the plasma production chamber.

The invention advantageously utilizes the ion beam, which is originally present for the processing of the substrate, for generating secondary electrons and in turn the plasma ignition. The plasma may be ignited by the utilization of the ion beam and applying a positive voltage to the plasma production chamber. Accordingly, the plasma igniting operation is very simple, and complicated means is not needed for the plasma ignition. Further, the invention does not cause the problems of metal contamination, surge voltage generation, or complicated maintenance.

Also in the invention, the DC power source controls not only the plasma ignition operation as mentioned above, but also the amount of electrons emitted from the plasma production chamber after the plasma ignition. By controlling the amount of emitted electrons, the charge-up in the substrate surface is suppressed, and the charge voltage of the substrate surface may be further reduced. Moreover, one DC power source may be used for both the plasma ignition control and the emitted electron amount control. Therefore, the construction is simplified and the cost is reduced when comparing with the case where multiple power sources are required for those controls.

Where this method is used, the plasma can reliably be ignited in the plasma generator, and complicated means is not needed for the plasma ignition. Further, the ion beam irradiation apparatus does not cause the problems of metal contamination, surge voltage generation, or complicated maintenance. The metal contamination of the semiconductor substrate is a serious problem in the fabrication of the semiconductor devices. The invention can prevent this problem. Accordingly, the invention improves the performances of the semiconductor device, and the production yield in the stage of manufacturing the semiconductor devices.

Additionally, the amount of electrons emitted from the plasma production chamber can be controlled by applying a negative voltage to the plasma generator when the semiconductor substrate is irradiated with the ion beam. By the electron amount control, the charge-up in the substrate surface is suppressed, and the charge voltage of the substrate surface may be further reduced. As a result, the dielectric breakdown of the semiconductor device during the ion beam irradiation is prevented to improve the production yield in the fabrication stage of the semiconductor device. Further, the fabrication method may also be applied to the microfabrication of semiconductor devices.

What is claimed is:

1. A method of operating an ion beam irradiation apparatus comprising the steps of:
   (a) applying a positive voltage to a plasma generator by a DC power source when the ion beam travels in a vacuum chamber;
   (b) leading secondary electrons into the plasma generator from the vacuum chamber by the positive voltage, the secondary electrons being generated by a collision of the ion beam with the plasma generating gas which is flown out of the plasma generator into the vacuum chamber by the positive voltage;
   (c) igniting a plasma by the secondary electrons as a trigger of an ignition, when a radio frequency generator introduces a radio frequency;
   (d) irradiating the ion beam on a substrate; and
   (e) supplying the plasma to the substrate for suppressing a charge-up of the substrate while irradiating the plasma on the substrate.

2. The method according to claim 1, further comprising the step of:
   (f) switching to apply a negative voltage to the plasma generator by the DC power source for controlling an amount of the plasma while irradiating the ion beam on the substrate.

3. A method of implanting ions into a semiconductor substrate by an ion beam irradiation for fabricating a semiconductor device, the method comprising the steps of:
   (a) applying a positive voltage to a plasma generator by a DC power source when the ion beam travels in a vacuum chamber;
   (b) leading secondary electrons into the plasma generator from the vacuum chamber by the positive voltage, the secondary electrons being generated by a collision of the ion beam with the plasma generating gas which is flown out of the plasma generator into the vacuum chamber by the positive voltage; and
   (c) igniting a plasma by the secondary electrons as a trigger of an ignition when a radio frequency generator introduces a radio frequency in the plasma generator irradiating the ion beam on the semiconductor substrate; and
   (d) supplying the plasma on the semiconductor substrate for suppressing a charge up of the semiconductor substrate while the plasma is irradiated on the semiconductor substrate.

4. An ion beam irradiation apparatus for irradiating an ion beam on a substrate comprising:
   a vacuum chamber for generating secondary electrons when the ion beam collides with an ion generating gas therein; and
   a plasma generator connected to the vacuum chamber, the plasma generator including:
     a radio frequency discharge generator for generating a frequency discharge;
     an ion generating gas introducer for introducing the ion generating gas into the plasma generator; and
     a DC power source connected between the plasma generator and the ground,
     wherein the DC power source applies a positive voltage to the plasma generator so that the secondary electrons are led into the plasma generator, when the secondary electrons are generated in the vacuum chamber, and the led secondary electrons, as an ignition trigger, ignite a plasma in the plasma generator when the radio frequency discharge generator introduces a radio frequency into the vacuum chamber.

5. The ion beam irradiation apparatus according to claim 4, wherein the DC power source provides an energy to each of the secondary electrons by applying a positive voltage V to the plasma generator, and the positive voltage defined by a first ionizing energy E1 of an atom or a molecule included in the plasma generating gas and an energy E2 of each of the secondary electrons satisfies a function:

$$V > (E1 - E2)/e \ [V].$$

6. The ion beam irradiation apparatus according to claim 4, wherein the DC power source controls an amount of electrons in the plasma by switching to apply a negative voltage to the plasma generator, after secondary electrons ignite the plasma.

* * * * *